(12) United States Patent
Fujii

(10) Patent No.: US 7,474,156 B2
(45) Date of Patent: Jan. 6, 2009

(54) IMPEDANCE TRANSFORMER FOR AMPLIFIER AND AMPLIFIER INCLUDING THE SAME

(75) Inventor: Kohei Fujii, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 61 days.

(21) Appl. No.: 11/753,706

(22) Filed: May 25, 2007

(65) Prior Publication Data

US 2008/0290948 A1 Nov. 27, 2008

(51) Int. Cl.
  *H03F 3/68* (2006.01)
(52) U.S. Cl. ............ 330/295; 330/124 R; 330/53
(58) Field of Classification Search ........ 330/295, 330/124 R, 53

See application file for complete search history.

(56) References Cited

U.S. PATENT DOCUMENTS

| | | | | |
|---|---|---|---|---|
| 5,066,925 A | * | 11/1991 | Freitag | 330/269 |
| 5,111,157 A | * | 5/1992 | Komiak | 330/286 |
| 5,955,926 A | * | 9/1999 | Uda et al. | 330/295 |
| 6,566,956 B2 | * | 5/2003 | Ohnishi et al. | 330/295 |
| 7,026,876 B1 | * | 4/2006 | Esfandiari et al. | 330/295 |
| 7,064,606 B2 | * | 6/2006 | Louis | 330/124 R |

* cited by examiner

*Primary Examiner*—Patricia Nguyen

(57) ABSTRACT

An amplifier has an input port, an output port, N gain elements in parallel, an input power splitter coupled between the input port of the amplifier and the input ports of the N gain elements, an output resistor chain extending between the output ports of the first through Nth gain elements, and an output power combiner coupled between the output ports of the N gain elements and the output port of the amplifier. The output power combiner presents a corresponding input impedance to each of the N gain elements. At least two of the input impedances presented by the output power combiner to the N gain elements are substantially different from each other.

18 Claims, 7 Drawing Sheets

RF_OUT

US 7,474,156 B2

IMPEDANCE TRANSFORMER FOR AMPLIFIER AND AMPLIFIER INCLUDING THE SAME

BACKGROUND

As radio frequency (RF), microwave, and millimeter-wave communication systems and devices continue to proliferate, there is an increasing need for more compact and efficient amplifiers in these frequency bands that can produce a desired output signal level.

FIG. 1 shows an amplifier 100 including first, second, third, and fourth gain elements 110-1 through 110-4, input power splitter 120, input resistor chain 140, output resistor chain 160, and output power combiner 180. Various conventional elements providing DC bias voltages and DC bias currents to first through fourth gain elements 110-1 through 110-4 are omitted from FIG. 1 for simplification of the drawing and the description to follow.

In a beneficial arrangement, first, second, third, and fourth gain elements 110-1 through 110-4 comprise substantially identical field effect transistors (FETs). However, other gain elements such as bipolar transistors could be employed instead.

Input power splitter 120 comprises: capacitor 121 connected between an input terminal 102 of amplifier 100 and a fixed voltage (e.g., ground); inductors 122, 123 connected between input terminal 102 of amplifier 100 and first and second splitter nodes 150 and 155, respectively; capacitors 124 and 125 connected between first and second splitter nodes 150 and 155, respectively, and the fixed voltage (e.g., ground); inductors 126 and 127 connected between corresponding input ports (e.g., gates) of first and second gain elements 110-1 and 110-2, and first splitter node 150; and inductors 128 and 129 connected between corresponding input ports (e.g., gates) of third and fourth gain elements 110-3 and 110-4, and second splitter node 155. Capacitors 121 and inductors 122 and 123 comprise an input stage of input power splitter 120 that couples input terminal 102 of amplifier 100 to first and second splitter nodes 150 and 155.

Input power splitter 120 is a symmetrical network. In particular, inductors 126, 127, 128 and 129 have substantially the same inductance values as each other, L1.

In this context, and throughout this disclosure, "substantially the same" means that the values are the same within the reasonable manufacturing tolerances of the device. By contrast, "substantially different" means substantially not the same, and therefore "more different" than the reasonable manufacturing tolerances of the device. In one embodiment, the tolerances of inductors 126, 127, 128 and 129 are such that all of the inductance values are within 5% of each other, and therefore are deemed to be "substantially the same," while "substantially different" means that the values may be different from each other by 5% or more.

Input resistor chain 140 comprises: first resistor 142 connected between an input port (e.g., gate) of first gain element 110-1 and an input port (e.g., gate) of second gain element 110-2; second resistor 144 connected between an input port (e.g., gate) of second gain element 110-2 and an input port (e.g., gate) of third gain element 110-3; and third resistor 146 connected between an input port (e.g., gate) of third gain element 110-3 and an input port (e.g., gate) of fourth gain element 110-4. In general, resistors 142, 144 and 146 have substantially the same resistance values as each other, R1.

Output resistor chain 160 comprises: first resistor 162 connected between an output port (e.g., drain) of first gain element 110-1 and an output port (e.g., drain) of second gain element 110-2; second resistor 164 connected between an output port (e.g., drain) of second gain element 110-2 and an output port (e.g., drain) of third gain element 110-3; and third resistor 166 connected between an output port (e.g., drain) of third gain element 110-3 and an output port (e.g., drain) of fourth gain element 110-4. In general, resistors 162, 164 and 166 have substantially the same resistance values as each other, R2.

Output power combiner 180 comprises: capacitor 181 connected between an output terminal 104 of amplifier 100 and a fixed voltage (e.g., ground); inductors 182, 183 connected between output terminal 104 of amplifier 100 and first and second output combiner nodes 170 and 175, respectively; capacitors 184 and 185 connected between first and second output combiner nodes 170 and 175, respectively, and the fixed voltage (e.g., ground); inductors 186 and 187 connected between corresponding output ports (e.g., drains) of first and second gain elements 110-1 through 110-2 and first output combiner node 170; and inductors 188 and 189 connected between corresponding output ports (e.g., drains) of third and fourth gain elements 110-3 through 110-4 and second output combiner node 175. Capacitor 181 and inductors 182 and 183 comprise an output stage of output power combiner 180 that couples first and second combiner nodes 170 and 175 to amplifier output terminal 104.

Output power combiner 180 is a symmetrical network. In particular, inductors 186, 187, 188 and 189 have substantially the same inductance values as each other, L2.

In operation, amplifier 100: splits or divides an input signal (e.g., an RF, microwave, or millimeter-wave signal), received at input terminal 102, among the four gain elements 110-1 through 110-4 by means of input power splitter 120; amplifies the divided signal with each of the gain elements 110-1 through 110-4; and combines the output signals from the gain elements 110-1 through 110-4 by means of output power combiner 180 to produce an amplified output signal at output terminal 104. Input and output resistor chains 140 and 160 dampen oscillations that otherwise might occur with respect to gain elements 110-1 through 110-4 due to short-term voltage variations at the devices' output ports (drains).

Of significance, input power splitter 120 and output power combiner 180 serve not only to divide the input signal and combine the output signals of each gain elements 110-1 through 110-4, respectively, but also serve as impedance transformers to attempt to match impedances seen by the input ports (e.g., gates) and output ports (e.g., drains) of gain elements 110-1 through 110-4 to the corresponding impedances of the devices themselves, at the frequency(s) of the signal being amplified. More specifically, input power splitter 120 attempts to match the output impedance (e.g., 50 ohms) of an element supplying the input signal, to the input impedances at the input ports (e.g., gates) of gain elements 110-1 through 110-4. Similarly, output power combiner 180 attempts to match the output impedances at the output ports (e.g., drains) of gain elements 110-1 through 110-4 to an input impedance (e.g., 50 ohms) of an element (e.g., an antenna) receiving the amplified output signal from amplifier 100. Also of benefit, input power splitter 120 and output power combiner 180 are each configured in a low pass filter configuration so as to reduce any upper harmonic content of the signal that is being amplified (a bandpass filter configuration could be employed instead).

However, the aforementioned amplifier has some drawbacks. In particular, the impedance seen at the output ports (e.g., drains) of gain elements 110-1 through 110-4 is not the same for each device because the number of resistors in output resistor chain 160 that are connected to the output ports of gain elements 110-2 and 110-3 is different from the number of resistors connected to the output ports of gain elements 110-1 and 110-4, creating an unbalanced load condition for gain elements 110-1 through 110-4. As a result, amplifier 100 exhibits an early compression problem where the power level of the amplified output signal at output terminal 104 is less than expected. In particular, the power of the amplified output signal at output terminal 104 does not reach the expected output power level which should be approximately four times the output power level of each gain element, whose output power levels should all be approximately the same as each other. This problem may be exacerbated to a minor extent by the unbalanced loads at the input ports (e.g., gates) of gain elements 110-1 and 110-4 due to input resistor chain 140.

An additional resistor could be added to output resistor chain 160 to connect the output ports of gain elements 110-1 to the output port of 110-4, but this is undesirable because of space and routing limitations. Also, a similar degradation occurs, but to a lesser effect, due to the unbalanced conditions at the input ports of gain elements 110-1 and 110-4 because of different numbers of resistors of input resistor chain 140 being connected to the input ports of gain elements 110-2 and 110-3, versus elements 110-1 and 110-4.

What is needed, therefore, is an amplifier with a greater output power level, given the same individual gain elements. What is also needed is an amplifier including an output power combiner that provides an optimum load condition to all of the individual gain elements.

SUMMARY

In an example embodiment, an amplifier comprises: an input terminal adapted to receive an input signal to be amplified; an output terminal adapted to output an amplified output signal; first, second, third, and fourth gain elements each having an input port and an output port; an input power splitter coupled to the input terminal of the amplifier and adapted to split the input power and apply the split input signal to the input ports of the first through fourth gain elements; an output resistor chain comprising three resistors extending between and connecting the output ports of the first through fourth gain elements; and an output power combiner coupled to the output ports of the four gain elements and adapted to combine output signals from the four gain elements and provide the amplified output signal to the output terminal of the amplifier. The output power combiner includes: a first capacitor connected between a first combiner node and a fixed voltage; a second capacitor connected between a second combiner node and the fixed voltage; a first inductor connected between the output port of the first gain element and the first combiner node; a second inductor connected between the output port of the second gain element and the first combiner node; a third inductor connected between the output port of the third gain element and a second combiner node; a fourth inductor connected between the output port of the fourth gain element and the second combiner node; and an output stage coupling the first and second combiner nodes to the output port of the amplifier. At least two of the first, second, third, and fourth inductors have substantially different inductance values from each other.

In another example embodiment, an amplifier comprises: an input terminal adapted to receive an input signal to be amplified; an output terminal adapted to output an amplified output signal; first, second, third, and fourth gain elements each having an input port and an output port; an input power splitter coupled to the input terminal of the amplifier and adapted to split the input power and apply the split input signal to the input ports of the four gain elements; an output resistor chain comprising three resistors extending between and connecting the output ports of the first through fourth gain elements; and an output power combiner coupled to the output ports of the four gain elements and adapted to combine output signals from the four gain elements and provide the amplified output signal to the output terminal of the amplifier. The output power combiner includes: a first capacitor connected between a first combiner node and a fixed voltage, a second capacitor connected between a second combiner node and the fixed voltage, a first inductor connected between the output port of the first gain element and the first combiner node, a second inductor connected between the output port of the second gain element and the first combiner node, a third inductor connected between the output port of the third gain element and a second combiner node, a fourth inductor connected between the output port of the fourth gain element and the second combiner node, and an output stage coupling the first and second combiner nodes to the output terminal of the amplifier. The output power combiner also includes a fifth inductor connected between the output port of the first gain element and the fixed voltage, a sixth inductor connected between the output port of the second gain element and the fixed voltage, a seventh inductor connected between the output port of the third gain element and the fixed voltage, an eighth inductor connected between the output port of the fourth gain element and the fixed voltage. The first, second, third, and fourth inductors have substantially the same inductance values as each other, and at least two of the fifth, sixth, seventh, and eighth inductors have substantially different inductance values from each other.

In yet another example embodiment, an amplifier comprises: an input terminal adapted to receive an input signal to be amplified; an output terminal adapted to output an amplified output signal; first through $N^{th}$ gain elements each having an input port and an output port; an input power splitter coupled to the input terminal of the amplifier and adapted to split the input power and apply the split input signal to the input ports of the first through $N^{th}$ gain elements; an output resistor chain comprising N–1 resistors extending between and connecting the output ports of the first through $N^{th}$ gain elements; and an output power combiner coupled to the output ports of the N gain elements and adapted to combine output signals from the N gain elements and provide the amplified output signal to the output terminal of the amplifier. The output power combiner presents a corresponding input impedance to each of the N gain elements, and at least two of the input impedances presented by the output power combiner to the N gain elements are substantially different from each other.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 1:
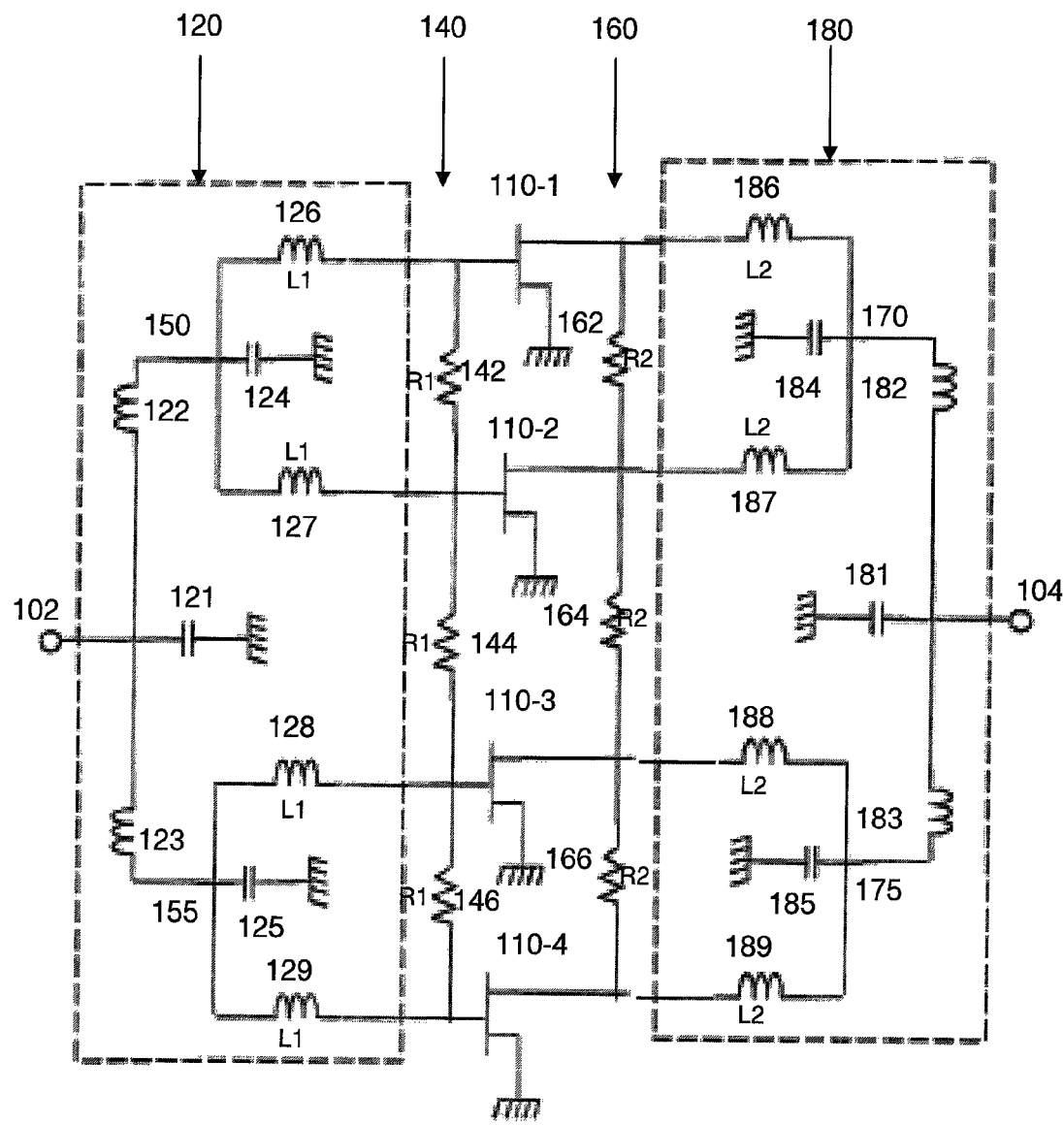
FIG. 1 shows an amplifier.
Figure 2:
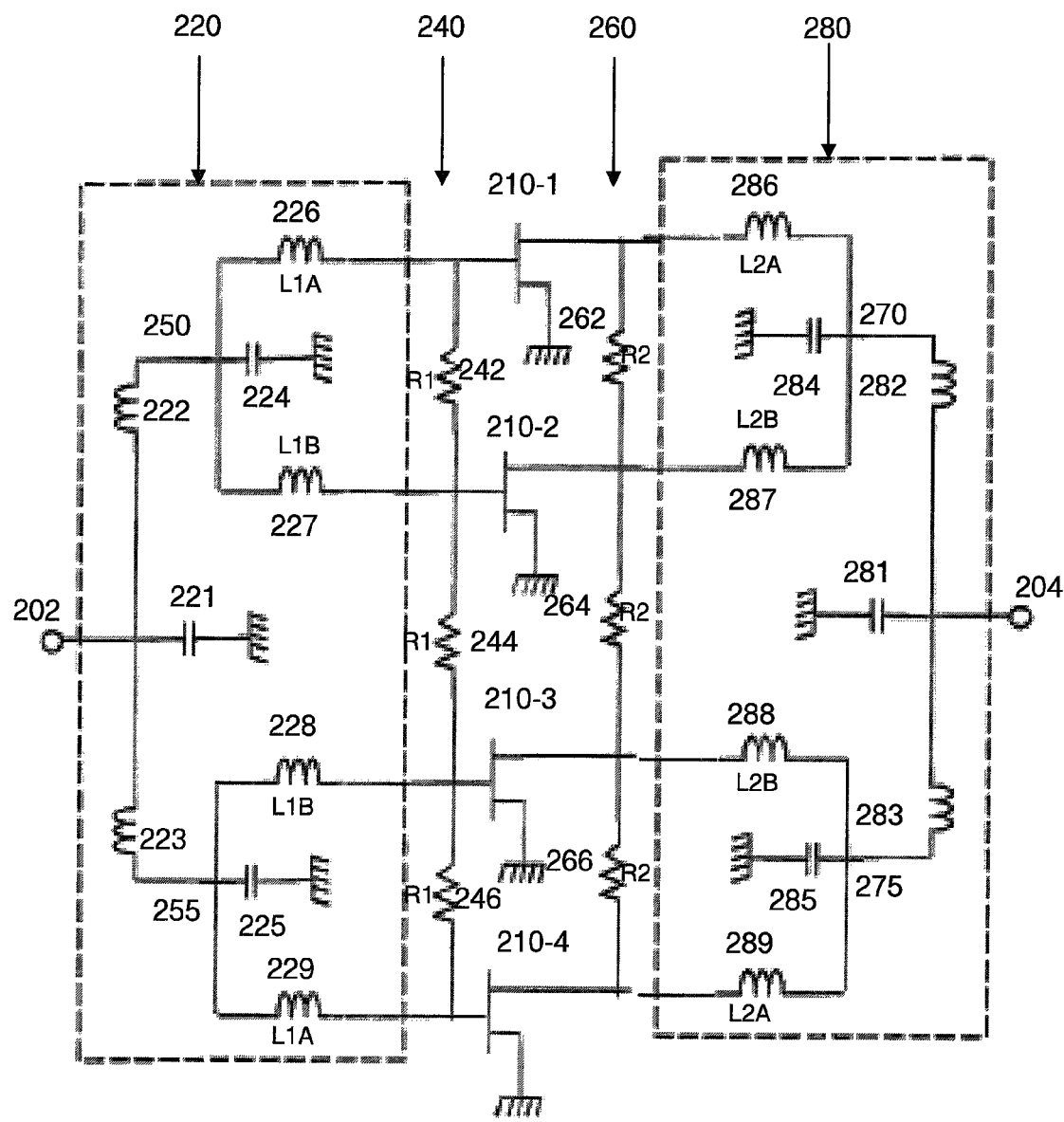
FIG. 2 shows one embodiment of an amplifier having an improved output power combiner and impedance matching network.

FIG. 2 shows one embodiment of an amplifier 200 having an improved output power combiner and impedance matching network. Amplifier 200 includes first, second, third, and fourth gain elements 210-1 through 210-4, input power splitter 220, input resistor chain 240, output resistor chain 260, and output power combiner 280. Various conventional elements providing DC bias voltages and DC bias currents to first through fourth gain elements 210-1 through 210-4 are omitted from FIG. 2 for simplification of the drawing and the description to follow.

In a beneficial arrangement, first, second, third, and fourth gain elements 210-1 through 210-4 comprise substantially identical field effect transistors (FETs).

Input power splitter 220 comprises: capacitor 221 connected between an input terminal 202 of amplifier 200 and a fixed voltage (e.g., ground); inductors 222, 223 connected between input terminal 202 of amplifier 200 and first and second splitter nodes 250 and 255, respectively; capacitors 224 and 225 connected between first and second splitter nodes 250 and 255, respectively, and the fixed voltage (e.g., ground); inductors 226 and 227 connected between corresponding input ports (e.g., gates) of first and second gain elements 210-1 through 210-2 and first splitter node 250; and inductors 228 and 229 connected between corresponding input ports (e.g., gates) of third and fourth gain elements 210-3 through 210-4 and second splitter node 255. Capacitor 221 and inductors 222 and 223 comprise an input stage of input power splitter 220 that couples input terminal 202 of amplifier 200 to first and second splitter nodes 250 and 255.

Input power splitter 220 is an asymmetrical network. Inductors 226 and 229 have inductance values that are substantially the same as each other, and inductors 227 and 228 have inductance values that are substantially the same as each other. However, the inductance value, L1A, of inductors 226 and 229 is substantially different from the inductance value, L1B, of inductors 227 and 228. To be more specific, in the embodiment of FIG. 2 inductors 226 and 229 each have an inductance value L1A that is substantially smaller than the inductance value, L1B, of inductors 227 and 228.

Input resistor chain 240 comprises: first resistor 242 connected between an input port (e.g., gate) of first gain element 210-1 and an input port (e.g., gate) of second gain element 210-2; second resistor 244 connected between an input port (e.g., gate) of second gain element 210-2 and an input port (e.g., gate) of third gain element 210-3; and third resistor 246 connected between an input port (e.g., gate) of third gain element 210-3 and an input port (e.g., gate) of fourth gain element 210-4. In general, resistors 242, 244 and 246 have substantially the same resistance values as each other, R1.

Output resistor chain 260 comprises: first resistor 262 connected between an output port (e.g., drain) of first gain element 210-1 and an output port (e.g., drain) of second gain element 210-2; second resistor 264 connected between an output port (e.g., drain) of second gain element 210-2 and an output port (e.g., drain) of third gain element 210-3; and third resistor 266 connected between an output port (e.g., drain) of third gain element 210-3 and an output port (e.g., drain) of fourth gain element 210-4. In general, resistors 262, 264 and 266 have substantially the same resistance values as each other, R2.

Output power combiner 280 comprises: capacitor 281 connected between an output terminal 204 of amplifier 200 and a fixed voltage (e.g., ground); inductors 282, 283 connected between output terminal 204 of amplifier 200 and first and second output combiner nodes 270 and 275, respectively; capacitors 284 and 285 connected between first and second output combiner nodes 250 and 255, respectively, and the fixed voltage (e.g., ground); inductors 286 and 287 connected between corresponding output ports (e.g., drains) of first and second gain elements 210-1 through 210-2 and first output combiner node 270; and inductors 288 and 289 connected between corresponding output ports (e.g., drains) of third and fourth gain elements 210-3 through 210-4 and second output combiner node 275. Capacitor 281 and inductors 282 and 283 comprise an output stage of output power combiner 280 that couples first and second combiner nodes 270 and 275 to amplifier output terminal 204.

Output power combiner 280 is an asymmetrical network. Inductors 286 and 289 have inductance values that are substantially the same as each other, and inductors 287 and 288 have inductance values that are substantially the same as each other. However, the inductance value, L2A, of inductors 286 and 289 is substantially different from the inductance value, L2B, of inductors 287 and 288. To be more specific, in the embodiment of FIG. 2 inductors 286 and 289 each have an inductance value L2A that is substantially smaller than the inductance value, L2B, of inductors 287 and 288.

In operation, amplifier 200: splits or divides an input signal, received at input terminal 202, among the four gain elements 210-1 through 210-4 by means of input power splitter 220; amplifies the divided signal with each of the gain elements 210-1 through 210-4; and combines the output signals from the gain elements 210-1 through 210-4 by means of output power combiner 280 to produce an amplified output signal at output terminal 204. Input and output resistor chains 240 and 260 dampen oscillations that otherwise might occur with respect to gain elements 210-1 through 210-4 due to short-term voltage variations at the devices' output ports (drains).

Of significance, input power splitter 220 and output power combiner 280 serve not only to divide the input signal and combine the output signals of each gain element 210-1 through 210-4, respectively, but also serve as impedance transformers to match impedances seen by the input ports (e.g., gates) and output ports (e.g., drains) for gain elements 210-1 through 210-4 to the corresponding impedances of the devices themselves, at the frequency(s) of the signal being amplified. More specifically, input power splitter 220 matches the output impedance (e.g., 50 ohms) of an element supplying the input signal, to the input impedances at the input ports (e.g., gates) of gain elements 210-1 through 210-4. Similarly, output power combiner 280 matches the output impedances at the output ports (e.g., drains) of gain elements 210-1 through 210-4 to an input impedance (e.g., 50 ohms) of an element (e.g., an antenna) receiving the amplified output signal from amplifier 200. In a beneficial arrangement, input power splitter 220 and output power combiner 280 are also each configured in a low pass filter configuration so as to reduce any upper harmonic content of the signal that is being amplified (a bandpass filter configuration could be employed instead).

Of significance, as explained above in amplifier 200 the inductance values of inductors 286, 287, 288 and 289 are not all substantially the same as each other. Instead, the inductance values are different to reflect the different impedances seen by the output ports of gain elements 210-1 through 210-4 due to the unbalanced loads presented to gain elements 210-1 through 210-4 by the resistors of output resistor chain 260. In an exemplary embodiment, gain elements 210-1 through 210-4 each have an optimum output impedance at the operating frequency of the signal being amplified of about 2-10 ohms. Meanwhile, resistors 262, 264 and 266 have the same resistance value as each other, which in an exemplary embodiment, is between 10 ohms and 50 ohms.

In that case, filter synthesis software can be employed to determine values for inductors 286, 287, 288 and 289 (and the remaining elements of output power combiner 280) which will match the output impedances of gain elements 210-1 through 210-4 at the frequency(s) of the signal being amplified, to an input impedance (e.g., 50 ohms) of a device which is connected to output terminal 204 to receive the amplified output signal, for example an antenna.

As explained above, inductors 286 and 289 are selected to have inductance values that are substantially the same as each other, and inductors 287 and 288 are selected to have inductance values that are substantially the same as each other. However, the inductance value, L2A, of inductors 286 and 289 is substantially different from the inductance value, L2B, of inductors 287 and 288. To be more specific, in the embodiment of FIG. 2 inductors 286 and 289 each have an inductance value L2A that is substantially smaller than the inductance value, L2B, for inductors 287 and 288, to compensate for the different impedances seen at the output ports of gain elements 210-1 and 210-4, compared to gain elements 210-2 and 210-3, due to the unbalanced load of output resistor chain 260.

As a result, optimum load conditions are presented to the output ports of each of the gain elements 210-1 through 210-4, and therefore an early compression problem for amplifier 200 can be ameliorated and the power of the amplified output signal at output terminal 204 reaches the expected output power level which is approximately four times the output power levels of each gain element, whose output power levels are all approximately the same.

Furthermore, in amplifier 200, the inductance value, L1A, of inductors 226 and 229 is substantially different from the inductance value, L1B, of inductors 227 and 228. To be more specific, in the embodiment of FIG. 2 inductors 226 and 229 each have an inductance value L1A that is substantially smaller than the inductance value, L1B, for inductors 227 and 228. This arrangement allows optimum load conditions to be presented to the input ports (e.g., gates) of each of the gain elements 210-1 through 210-4.

However, it should be understood that the matching of the output impedances seen by gain elements 210-1 through 210-4 is more critical to achieving an optimum output power level than matching the input impedances seen by gain elements 210-1 through 210-4, and so the matching of the input ports can be omitted with a minor degradation in performance that may be negligible.

Figure 3:
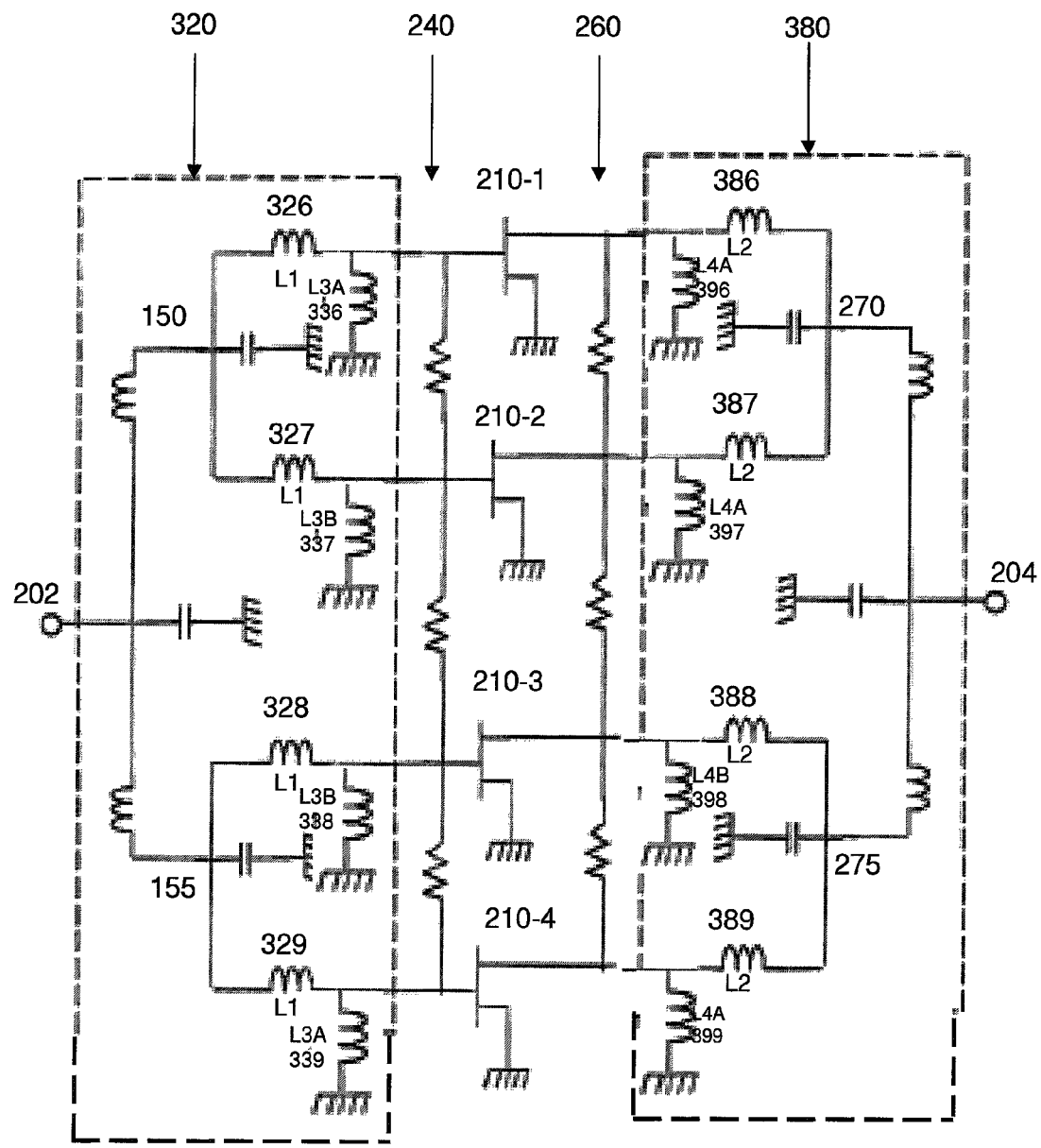
FIG. 3 shows another embodiment of an amplifier having an improved output power combiner and impedance matching network.

FIG. 3 shows another embodiment of an amplifier 300 having an improved output power combiner and impedance matching network. Amplifier 300 is similar to amplifier 200 as described above, and therefore for brevity and simplification of explanation, only the differences will be described.

In place of inductors 226, 227, 228, and 229 in FIG. 2, input power splitter 320 of amplifier 300 includes series inductors 326, 327, 328, and 329 all having a same inductance value as each other. Also, input power splitter 320 includes shunt inductors 336, 337, 338, and 339 connected between the input ports (e.g., gates) of corresponding ones of gain elements 210-1 through 210-4, and a fixed voltage (e.g., ground). Input power splitter 320 is an asymmetrical network. Inductors 336 and 339 have inductance values that are substantially the same as each other, and inductors 337 and 338 have inductance values that are substantially the same as each other. However, the inductance value, L3A, of inductors 336 and 339 is substantially different from the inductance value, L3B, of inductors 337 and 338. To be more specific, in the embodiment of FIG. 3 inductors 336 and 339 each have an inductance value L3A that is substantially greater than the inductance value, L3B, of inductors 337 and 338.

Similarly, in place of inductors 286, 287, 288, and 289 in FIG. 2, output power combiner 380 of amplifier 300 includes series inductors 386, 387, 388, and 389 all having a same inductance value as each other. Also, output power combiner 380 includes shunt inductors 396, 397, 398, and 399 connected between the output ports (e.g., drains) of corresponding ones of gain elements 210-1 through 210-4, and a fixed voltage (e.g., ground). Output power combiner 380 is an asymmetrical network. Inductors 396 and 399 have inductance values that are substantially the same as each other, and inductors 397 and 398 have inductance values that are substantially the same as each other. However, the inductance value, L4A, of inductors 396 and 399 is substantially different from the inductance value, L4B, of inductors 397 and 398. To be more specific, in the embodiment of FIG. 3 inductors 396 and 399 each have an inductance value L4A that is substantially greater than the inductance value, L4B, of inductors 397 and 398.

As before, filter synthesis software can be employed to determine the values for the remaining elements of input power splitter 320 and output power combiner 380.

Also as before, as a result of the arrangement of FIG. 3, optimum load conditions are presented to the output ports of each of the gain elements 210-1 through 210-4, and therefore an early compression problem for amplifier 300 can be ameliorated and the power of the amplified output signal at output terminal 204 reaches the expected output power level which is approximately four times the output power level of each gain element, whose output power levels are all approximately the same Also, it should be understood that in another embodiment, the input power splitter arrangement of amplifier 200 of FIG. 2 could be employed with an amplifier that includes the output power combiner arrangement of amplifier 300 of FIG. 3, and vice versa.

Although the above examples have been presented with respect to amplifiers having four gain elements, it should be understood that the principles can be extended to amplifiers having more than four gain elements.

Figure 4:
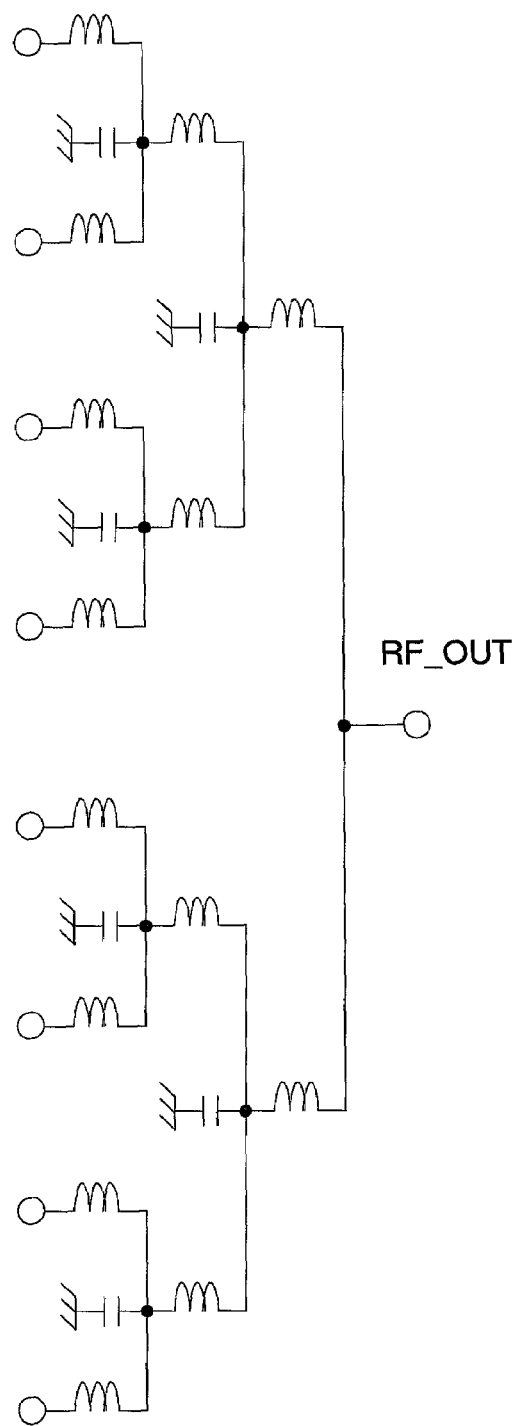
FIGS. 4-5 illustrate one embodiment of an output power combiner 400 for an amplifier having eight gain elements.
Figure 5:
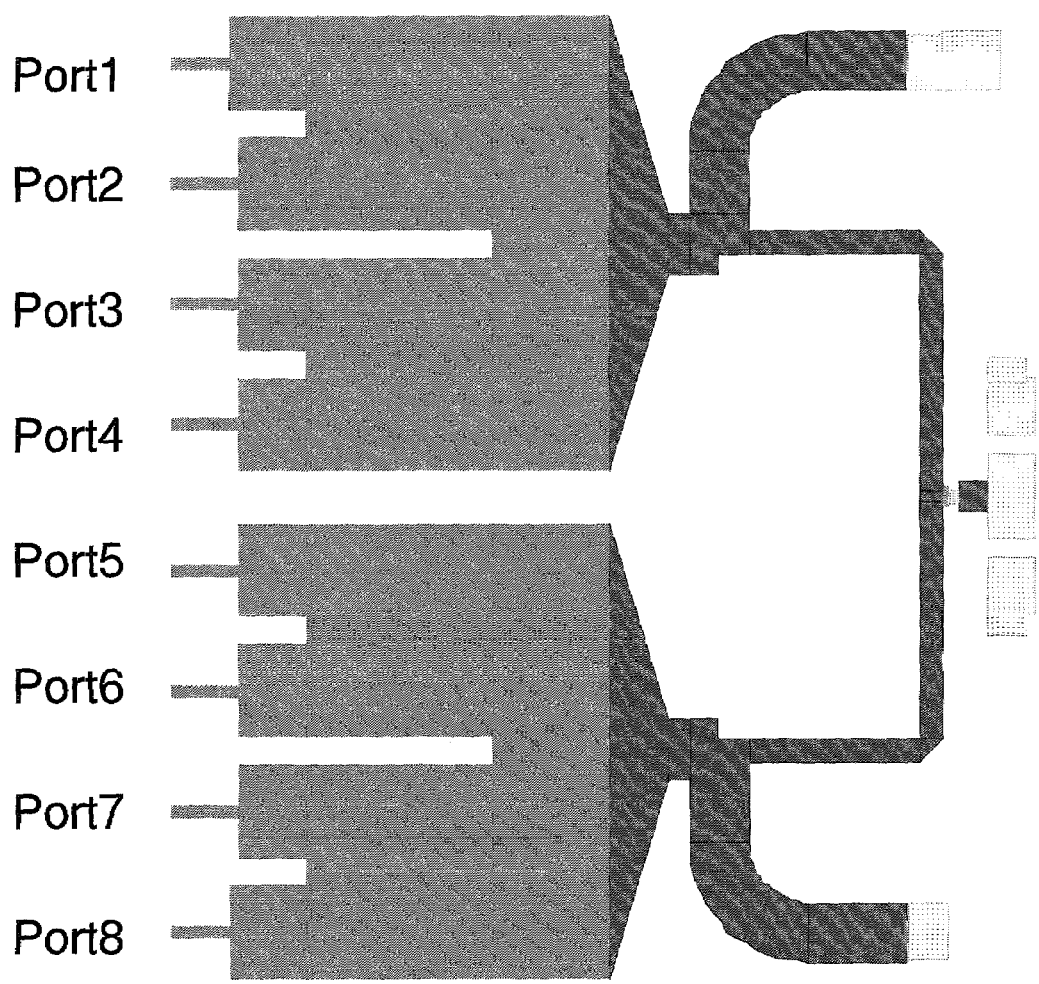

FIGS. 4-5 illustrate one embodiment of an output power combiner 400 for an amplifier having eight gain elements and therefore eight output ports. FIG. 4 shows a schematic diagram which is similar to the output power combiner 280, except it is for four gain elements instead of four. FIG. 5 shows an exemplary circuit layout illustrating one possible realization of the schematic shown in FIG. 4. As can be seen in FIG. 5 the series inductance elements connected to Port 1 and Port 9 are shorter than the series inductance elements connected to Ports 2-8, and therefore provide a smaller inductance.

Figure 6:
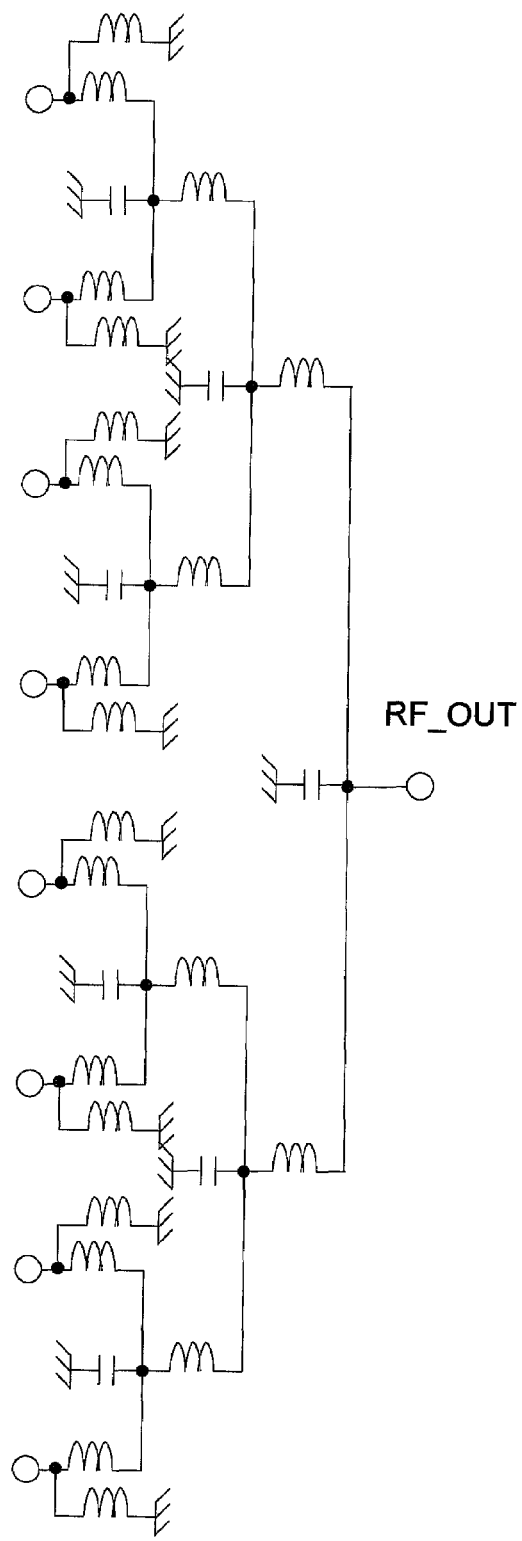
FIGS. 6-7 illustrate another embodiment of an output power combiner 400 for an amplifier having eight gain elements.
Figure 7:
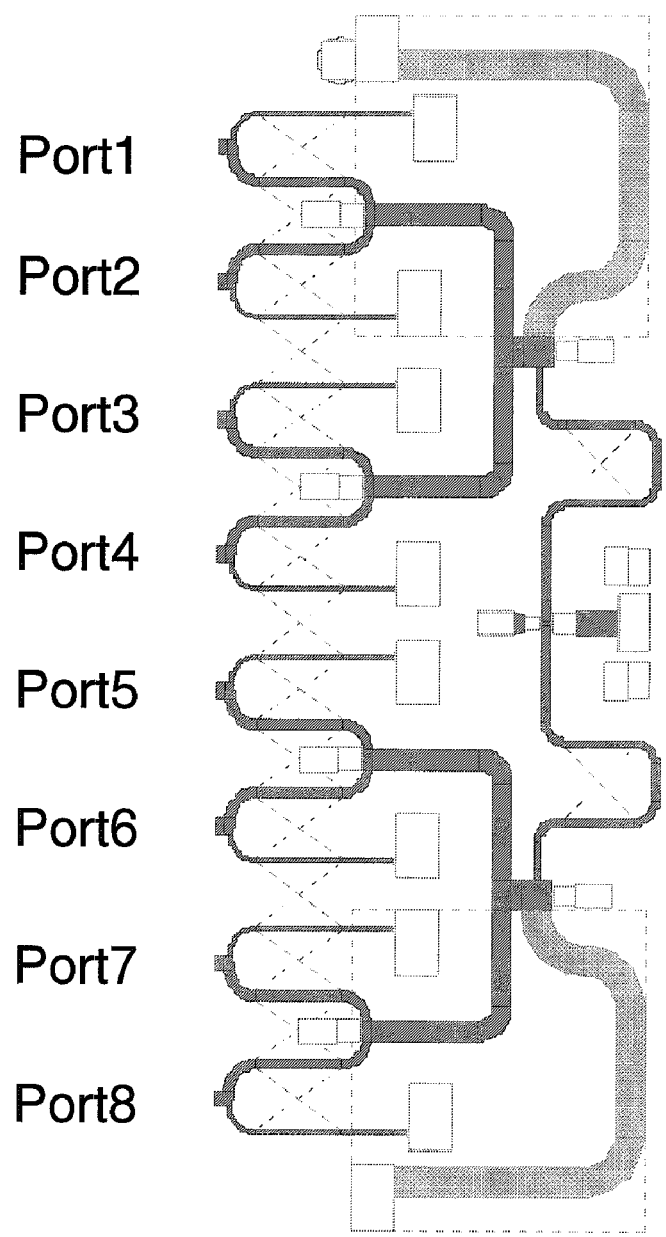

Meanwhile, FIGS. 6-7 illustrate another embodiment of an output power combiner 5400 for an amplifier having eight gain elements and therefore eight output ports. FIG. 6 shows a schematic diagram which is similar to the output power combiner 380, except it is for four gain elements instead of four. FIG. 7 shows an exemplary circuit layout illustrating one possible realization of the schematic shown in FIG. 6. As can be seen in FIG. 7 the shunt inductance elements connected to Port 1 and Port 9 are longer than the shunt inductance elements connected to Ports 2-8, and therefore provide a greater inductance.

In general, for an amplifier having N gain elements, the input power splitter is coupled to the input terminal of the amplifier and adapted to split the input power and apply the split input signal to the input ports of the first through Nth gain elements; the output resistor chain includes N−1 resistors extending between and connecting the output ports of the first through $N^{th}$ gain elements; and the output power combiner is coupled to the output ports of the N gain elements and adapted to combine output signals from the N gain elements and provide the amplified output signal to the output terminal of the amplifier. In that case, the output power combiner presents a corresponding input impedance to each of the N gain elements, and at least two of the input impedances presented by the output power combiner to the N gain elements are substantially different from each other.

In general, the input impedances presented by the output power combiner to the first and $N^{th}$ gain elements are substantially the same as each other, and the input impedances presented by the output power combiner to the second through $(N-1)^{th}$ gain elements are substantially the same as each other, and the input impedances presented by the output power combiner to the first and $N^{th}$ gain elements is substantially greater than the input impedances presented by the output power combiner to the second through $(N-1)^{th}$ gain elements.

In particular, the difference between the input impedances presented by the output power combiner to the first and $N^{th}$ gain elements, and the input impedances presented by the output power combiner to the second through $(N-1)^{th}$ gain elements, compensates for a difference in impedances of the output resistor chain seen by the output ports of the first and $N^{th}$ gain elements compared to impedances of the output resistor chain seen by the output ports of the second and through $(N-1)^{th}$ gain elements.

A similar extension in the case of more than fours gain elements can be applied with respect to the input power splitter.

While example embodiments are disclosed herein, one of ordinary skill in the art appreciates that many variations that are in accordance with the present teachings are possible and remain within the scope of the appended claims. For example, although the descriptions and figures above illustrate an exemplary case where a matching network multiplexes signals to and from an antenna and a plurality of filters, the matching network is not limited to use with an antenna. In general, any appropriate device, such as a broadband amplifier or filter, can be passively multiplexed with the plurality of filters using the matching network as described above. The embodiments therefore are not to be restricted except within the scope of the appended claims.

The invention claimed is:

1. An amplifier, comprising:
   an input terminal adapted to receive an input signal to be amplified;
   an output terminal adapted to output an amplified output signal;
   first, second, third, and fourth gain elements each having an input port and an output port;
   an input power splitter coupled to the input terminal of the amplifier and adapted to split the input power and apply the split input signal to the input ports of the first through fourth gain elements;
   an output resistor chain comprising three resistors extending between and connecting the output ports of the first through fourth gain elements; and
   an output power combiner coupled to the output ports of the four gain elements and adapted to combine output signals from the four gain elements and provide the amplified output signal to the output terminal of the amplifier,
   wherein the output power combiner comprises,
      a first capacitor connected between a first combiner node and a fixed voltage,
      a second capacitor connected between a second combiner node and the fixed voltage,
      a first inductor connected between the output port of the first gain element and the first combiner node,
      a second inductor connected between the output port of the second gain element and the first combiner node,
      a third inductor connected between the output port of the third gain element and a second combiner node,
      a fourth inductor connected between the output port of the fourth gain element and the second combiner node, and
      an output stage coupling the first and second combiner nodes to the output port of the amplifier,
   wherein at least two of the first, second, third, and fourth inductors have substantially different inductance values from each other.

2. The amplifier of claim 1, wherein the first and fourth inductors have substantially the same inductance as each other, and the second and third inductors have substantially the same inductance as each other, and wherein the inductance of the first and fourth inductors is substantially smaller than the inductance of the second and third inductors.

3. The amplifier of claim 1, further comprising an input resistor chain comprising three resistors extending between and connecting the input ports of the first through fourth gain elements.

4. The amplifier of claim 3, wherein the input power splitter comprises:
   a third capacitor connected between a first splitter node and the fixed voltage,
   a fourth capacitor connected between a second splitter node and the fixed voltage,
   a fifth inductor connected between the input port of the first gain element and the first splitter node,
   a sixth inductor connected between the input port of the second gain element and the first splitter node,
   a seventh inductor connected between the input port of the third gain element and a second splitter node,
   an eighth inductor connected between the input port of the fourth gain element and the second splitter node, and
   an input stage coupling the input terminal of the amplifier to the first and second splitter nodes, wherein at least two of the fifth, sixth, seventh, and eighth inductors have substantially different inductance values from each other.

5. The amplifier of claim 4, wherein the fifth and eighth inductors have substantially the same inductance as each other, and the sixth and seventh inductors have substantially the same inductance as each other, and wherein the inductance of the fifth and eighth inductors is substantially smaller than the inductance of the sixth and seventh inductors.

6. The amplifier of claim 1, wherein the four gain elements comprise four field effect transistors having substantially the same size as each other.

7. An amplifier, comprising:
an input terminal adapted to receive an input signal to be amplified;
an output terminal adapted to output an amplified output signal;
first, second, third, and fourth gain elements each having an input port and an output port;
an input power splitter coupled to the input terminal of the amplifier and adapted to split the input power and apply the split input signal to the input ports of the four gain elements;
an output resistor chain comprising three resistors extending between and connecting the output ports of the first through fourth gain elements; and
an output power combiner coupled to the output ports of the four gain elements and adapted to combine output signals from the four gain elements and provide the amplified output signal to the output terminal of the amplifier,
wherein the output power combiner comprises,
a first capacitor connected between a first combiner node and a fixed voltage,
a second capacitor connected between a second combiner node and the fixed voltage,
a first inductor connected between the output port of the first gain element and the first combiner node,
a second inductor connected between the output port of the second gain element and the first combiner node,
a third inductor connected between the output port of the third gain element and a second combiner node,
a fourth inductor connected between the output port of the fourth gain element and the second combiner node,
a fifth inductor connected between the output port of the first gain element and the fixed voltage,
a sixth inductor connected between the output port of the second gain element and the fixed voltage,
a seventh inductor connected between the output port of the third gain element and the fixed voltage,
an eighth inductor connected between the output port of the fourth gain element and the fixed voltage, and
an output stage coupling the first and second combiner nodes to the output terminal of the amplifier,
wherein the first, second, third, and fourth inductors have substantially the same inductance values as each other, and
wherein at least two of the fifth, sixth, seventh, and eighth inductors have substantially different inductance values from each other.

8. The amplifier of claim 7, wherein the fifth and eighth inductors have substantially the same inductance as each other, and the sixth and seventh inductors have substantially the same inductance as each other, and wherein the inductance of the fifth and eighth inductors is substantially greater than the inductance of the sixth and seventh inductors.

9. The amplifier of claim 7, further comprising an input resistor chain comprising three resistors extending between and connecting the input ports of the first through fourth gain elements.

10. The amplifier of claim 9, wherein the input power splitter comprises:
a third capacitor connected between a first splitter node and the fixed voltage,
a fourth capacitor connected between a second splitter node and the fixed voltage,
a ninth inductor connected between the input port of the first gain element and the first splitter node,
a tenth inductor connected between the input port of the second gain element and the first splitter node,
an eleventh inductor connected between the input port of the third gain element and a second splitter node,
a twelfth inductor connected between the input port of the fourth gain element and the second splitter node, and
an input stage coupling the input terminal of the amplifier to the first and second splitter nodes,
wherein at least two of the ninth, tenth, eleventh, and twelfth inductors have substantially different inductance values from each other.

11. The amplifier of claim 10, wherein the ninth and twelfth inductors have substantially the same inductance as each other, and the tenth and eleventh inductors have substantially the same inductance as each other, and wherein the inductance of the ninth and twelfth inductors is substantially greater than the inductance of the tenth and eleventh inductors.

12. The amplifier of claim 7, wherein the four gain elements comprise four field effect transistors having substantially the same size as each other.

13. An amplifier, comprising:
an input terminal adapted to receive an input signal to be amplified;
an output terminal adapted to output an amplified output signal;
first through $N^{th}$ gain elements each having an input port and an output port;
an input power splitter coupled to the input terminal of the amplifier and adapted to split the input power and apply the split input signal to the input ports of the first through $N^{th}$ gain elements;
an output resistor chain comprising N−1 resistors extending between and connecting the output ports of the first through $N^{th}$ gain elements; and
an output power combiner coupled to the output ports of the N gain elements and adapted to combine output signals from the N gain elements and provide the amplified output signal to the output terminal of the amplifier,
wherein the output power combiner presents a corresponding input impedance to each of the N gain elements, and
wherein at least two of the input impedances presented by the output power combiner to the N gain elements are substantially different from each other.

14. The amplifier of claim 13, wherein the input impedances presented by the output power combiner to the first and $N^{th}$ gain elements are substantially the same as each other, and the input impedances presented by the output power combiner to the second through $(N-1)^{th}$ gain elements are substantially the same as each other, and wherein the input impedances presented by the output power combiner to the first and $N^{th}$ gain elements is substantially greater than the input impedances presented by the output power combiner to the second through $(N-1)^{th}$ gain elements.

15. The amplifier of claim 14, wherein a difference between the input impedances presented by the output power combiner to the first and $N^{th}$ gain elements, and the input impedances presented by the output power combiner to the second through $(N-1)^{th}$ gain elements, compensates for a difference in impedances of the output resistor chain seen by the first and $N^{th}$ gain elements compared to impedances of the output resistor chain seen by the second and through $(N-1)^{th}$ gain elements.

16. The amplifier of claim 13, further comprising an input resistor chain comprising N−1 resistors extending between and connecting the input ports of the first though $N^{th}$ gain elements.

17. The amplifier of claim 16, wherein the input power splitter presents a corresponding output impedance to each of the N gain elements, and wherein at least two of the output impedances presented by the input power splitter to the N gain elements are substantially different from each other.

18. The amplifier of claim 13, wherein the N gain elements comprise N field effect transistors having substantially the same size as each other.

* * * * *